(12) United States Patent
Takechi

(10) Patent No.: US 6,790,580 B2
(45) Date of Patent: Sep. 14, 2004

(54) RESIST MATERIAL AND METHOD FOR FORMING A RESIST PATTERN WITH THE RESIST MATERIAL

(75) Inventor: Satoshi Takechi, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 43 days.

(21) Appl. No.: 10/326,414

(22) Filed: Dec. 23, 2002

(65) Prior Publication Data

US 2003/0143483 A1 Jul. 31, 2003

Related U.S. Application Data

(63) Continuation of application No. 08/800,227, filed on Feb. 12, 1997, now abandoned.

(30) Foreign Application Priority Data

Mar. 7, 1996 (JP) .............................. 8-049874

(51) Int. Cl.$^7$ .............................. G03F 7/004
(52) U.S. Cl. .................... 430/176; 430/189; 430/270.1; 430/326; 430/330; 430/905
(58) Field of Search ................................ 430/176, 189, 430/270.1, 326, 330, 905

(56) References Cited

U.S. PATENT DOCUMENTS

| | | | |
|---|---|---|---|
| 5,397,680 A | 3/1995 | Schadeli et al. | |
| 5,399,647 A | 3/1995 | Nozaki et al. | |
| 5,585,222 A | 12/1996 | Kaimoto et al. | |
| 5,660,969 A | 8/1997 | Kaimoto | |
| 5,665,518 A | 9/1997 | Maeda et al. | |
| 5,691,111 A | 11/1997 | Iwasa et al. | |

FOREIGN PATENT DOCUMENTS

| | | |
|---|---|---|
| JP | 4-26850 | 1/1992 |
| JP | 4-39665 | 2/1992 |
| JP | 4-211258 | 8/1992 |
| JP | 5-80515 | 4/1993 |
| JP | 5-257281 | 10/1993 |
| JP | 5-257284 | 10/1993 |
| JP | 5297591 | 11/1993 |

*Primary Examiner*—John S. Chu
(74) *Attorney, Agent, or Firm*—Westerman, Hattori, Daniels & Adrian, LLP (57) ABSTRACT

A resist material is made of a polymer or copolymer having a cyclic hydrocarbon as a skeletal structure and an alkali-soluble group to which a protective group is attached as a side chain. Because of the protective group, the resist material is insoluble in alkali solution. In addition, an acid generating agent is added to the resist material. When the acid generating agent is irradiated with a radiation ray, an acid is generated from the acid generating agent, and the protective group is detached from the alkali-soluble group by the function of the acid. Therefore, a resist film made of the resist material can be formed in a desired pattern by irradiating the resist film with the radiation ray. Also, because the cyclic hydrocarbon is used as the skeletal structure of the polymer or copolymer, a superior dry-etching resistance is obtained as compared with a conventional resist material in which acrylate resin is used as a skeletal structure, so that there is no probability that a patterned resist film is over-etched or deformed even though the patterned resist film is used as a mask in an etching process.

10 Claims, 2 Drawing Sheets

RESIST MATERIAL AND METHOD FOR FORMING A RESIST PATTERN WITH THE RESIST MATERIAL

This application is a continuation of prior application Ser. No. 08/800,227 filed Feb. 12, 1997 now abandoned.

BACKGROUND OF THE INVENTION

1. Field of the Invention

The present invention relates generally to a resist material and a method for forming a resist pattern with the resist material, and more particularly to a chemical amplifier resist and a method for forming a resist pattern with the chemical amplifier resist material.

2. Description of the Prior Art

An integration degree in a semiconductor integrated circuit has been heightened, a large scale integrated circuit (LSI) and a very large scale integrated circuit (VLSI) are put to practical use, a minimum pattern width in the integrated circuit is on the order of sub-microns, and the minimum pattern width has been moreover shortened.

When a micro-pattern is formed, a thin film or a substrate planned to be patterned is covered with a resist, the resist is selectively exposed to light to form a latent image of a desired pattern in the resist, the resist is developed, and a patterned resist is formed on the thin film or the substrate. Thereafter, the thin film or the substrate not covered with the patterned resist is dry-etched by using the patterned resist as a mask, and the resist pattern is removed. Therefore, the thin film on the substrate is formed in a desired pattern. This technique is called a lithography technique, and the lithography technique is necessary to make the LSI or VLSI.

In this case, ultraviolet light of a g line (a wave of 436 nm) or an i line (a wave of 365 nm) is used as the exposure light in the lithography technique. However, because the minimum pattern width has been moreover fined, light having a more shortened wavelength such as far ultraviolet light, vacuum ultraviolet light, an electron ray, an X ray has been used as the exposure light. In particular, the use of an excimer laser such as a KrF laser (a wave of 248 nm) or an ArF laser (a wave of 193 nm) as the exposure light has been recently paid attention, and the excimer laser is expected to be effective for the formation of the micro-pattern.

In this application, a word "radiation ray" denotes light emitted from one of various light sources such as ultraviolet light, far ultraviolet light, vacuum ultraviolet light, an electron ray, an X ray, one of various lasers or the like.

To form a micro-pattern on the order of sub-microns by using the exposure light ranging from the far ultraviolet light to the vacuum ultraviolet light of which a wavelength is shorter than that of the ultraviolet light currently used, it is required that transparency of a sensitive material for the exposure light having a specific wavelength is superior. Also, it is required that a material used as a resist has a superior dry-etching resistance.

As a resist material having the superior transparency and the superior dry-etching resistance, a radiation ray sensitive material characterized in that the material is a polymer or a copolymer of acrylic ester or α-substitution acrylic ester (acrylate resin) having an adamantane structure in an ester portion is proposed by inventors of this application in a Published Unexamined Japanese Patent Application H4-39665 (1992).

Also, as another resist material having the superior transparency and the superior dry-etching resistance, a chemical amplifier radiation ray sensitive material characterized in that the material is a polymer or a copolymer of acrylic ester or α-substitution acrylic ester (acrylate resin) having an norbornane structure in an ester portion is proposed by the inventors in a Published Unexamined Japanese Patent Application H5-257284 (1993).

In each of the above resist materials, about 50% alicyclic group unit is included in the resin resist to obtain the dry-etching resistance. However, there is a case that a type of layer planned to be etched moreover requires of the dry-etching resistance.

However, it is difficult to heighten the dry-etching resistance in cases where the above conventional resist having a structure of the acrylate resin is used.

SUMMARY OF THE INVENTION

An object of the present invention is to provide, with due consideration to the drawbacks of such a conventional resist material, a resist material having an etching resistance superior to that of a resist having a structure of the acrylate resin and a method for forming a resist pattern with the resist material.

In the present invention, a polymer or a copolymer comprising a skeletal structure composed of cyclic hydrocarbon and hydrocarbon and one or more alkali-soluble groups protected by one or more side chains (or one or more protective groups) is used as a resist material. This resist material is mixed with an acid generating agent in a solvent, and the resist material is set to a condition of a resist solution. Thereafter, the resist solution is coated on a thin film planned to be patterned, so that a resist film is formed on the thin film. Thereafter, the resist film is exposed to exposure light. Therefore, the resist film is partially irradiated with a radiation ray, and acid is generated in the acid generating agent which is included in portions of the resist film irradiated with the radiation ray.

Thereafter, the resist film is post-baked. Therefore, a chemical reaction performed while using the acid as catalyst is accelerated by the post baking, and the side chains are detached from the alkali-soluble groups by the chemical reaction. Thereafter, when the resist film is immersed into alkali-developing solution, the polymer or the copolymer composed of the cyclic hydrocarbon, the hydrocarbon and the alkali-soluble groups having no protecting side chain is dissolved in the alkali-developing solution. As a result, the portions of the resist film irradiated with the radiation ray is removed and the resist film having a particular pattern is formed on the thin film.

Thereafter, the thin film is etched while using the patterned resist film as a mask. In this case, because it is ascertained by an inventor's experiment that an etching resistance of a resin having a cyclic hydrocarbon as its skeletal structure is superior to that of the acrylate resin, even though the patterned resist film is used as a mask in the etching process, there is no probability that the patterned resist film is over-etched or deformed.

Accordingly, in cases where the resist material according to the present invention is used according to the above resist pattern forming method, the thin film can be correctly patterned even though a minimum pattern width required for the thin film is moreover shortened. Therefore, the resist material and the resist pattern forming method are useful for the manufacturing a semiconductor apparatus such as a semiconductor integrated circuit or the like.

DESCRIPTION OF THE PREFERRED EMBODIMENTS

Preferred embodiments of a resist material and a method for forming a resist pattern with the resist material according to the present invention are described with reference to drawings.

In embodiments according to the present invention, a resist material has not an acrylate resin as a skeletal structure but has a cyclic hydrocarbon as a skeletal structure. In addition, the resist material has a resin having an alkali-soluble group to which a protective group is attached as a side chain, so that the resist material is insoluble in alkali solution. Therefore, a superior dry-etching resistance is obtained.

As an example of the resist material, a resin expressed by a chemical structural formula (1) or a chemical structural formula (2) is used as the resist material. This resin is easily obtained by performing a ring-opening polymerization and a hydriding reaction following the ring-opening polymerization. However, the present invention is not limited to this resin. A general method of the ring-opening polymerization is, for example, disclosed in a literature "High Polymer Synthesis and Reaction (1)" published by Kyoritsu.

In chemical structural formulas of this application, a symbol "n" denotes a natural number.

Here, a symbol R denotes the protective group which is detached from the alkali-soluble group by a function of an acid, a symbol $R_1$ denotes a proton (H) or an alkyl group ($C_mH_{2m+1}$), and a symbol m denotes a natural number.

The resin expressed by the chemical structural formula (1) is obtained by performing a ring-opening polymerization for norbornene and performing a hydriding reaction for an obtained ring-opened polymer. A stream of reactions performed to obtain the resin expressed by the chemical structural formula (1) is shown in an equation (3).

Also, the resin expressed by the chemical structural formula (2) is obtained by performing a ring-opening polymerization for a 2-norbornene-2 substitution product and performing a hydriding reaction for an obtained ring-opened polymer. A stream of reactions performed to obtain the resin expressed by the chemical structural formula (2) is shown in an equation (4).

Because a skeletal structure of the resin expressed by the chemical structural formula (1) or (2) is made of hydrocarbon, it is difficult to decompose the resin as compared with the conventional acrylate resin, so that a superior dry-etching resistance can be obtained. Also, because a photo-sensitive group is arranged in each unit of the resin, a photo-sensitivity of the resin is maintained. In this case, the photo-sensitive group denotes an alkali-soluble group having a protective group, the protective group is detached from the alkali-soluble group by the function of acid generated from an acid generating agent when the acid generating agent is irradiated with exposure light, and the alkali-soluble group becomes soluble in alkali solution.

(Protective Group)

The protective group is, for example, a tertiary carbon ester such as t-butyl ester, t-amyl ester, 1-methyl-1-cyclohexyl ester, 2-methyl-2-adamantyl ester α, α-dimethyl benzyl ester or the like, ester formed of acetal such as tetra-hydro-pyranyl ester, 3-oxo ester such as 3-oxocyclohexyl ester, a 3-oxo-1-iso-propyl-butyl ester group, a 3-oxo-butyl ester group, 3-oxo-2-methyl-butyl ester group, a 3-oxo-1,1-di-methyl-butyl ester group or a 3-oxo-1-methyl-butyl ester group, or ester (shown by a chemical structural formula (6)) derived from a lactone ring shown by a chemical structural formula (5). However, the productive group is not limited to one of these materials.

(5)

(6)

(Acid Generating Agent)

In cases where the resist material expressed by the chemical structural formula (1) or (2) is used as a chemical amplifier resist, it is required to change the resist material to an alkali-soluble material by detaching the protective group attached to the alkali-soluble group from the alkali-soluble group. To detach the protective group from the alkali-soluble group, an acid generating agent from which acid is generated when the acid generating agent is irradiated with a radiation ray is required.

In case of the use of the chemical amplifier resist, the acid generating agent used with the polymer which is the resin expressed by the chemical structural formula (1) or (2) is an agent generally used in a chemical field of the resist. That is, proton acid (H–) is generated when the agent is irradiated with a radiation ray such as ultraviolet light, far ultraviolet light, vacuum ultraviolet light, an electron ray, an X ray, one of various lasers or the like.

As the acid generating agent appropriate to the present invention, a material including one of nine compounds is, for example, used. However, the material of the acid generating agent is not limited to the nine compounds.

(1) First compound: di-azonium salt expressed by a chemical structural formula (7).

$$Ar-N_2+X- \tag{7}$$

A symbol Ar in the chemical formula (7) denotes a substituted or non-substituted aromatic group (for example, a phenyl group) or a substituted or non-substituted alicyclic group. A symbol X denotes halogen such as Cl, BIr, I, F, $BF_4$, $BF_6$, $PF_6$, $AsF_6$, $SbF_6$, $CF_3SO_3$ or $ClO_4$ or organic sulfonic acid anion.

(2) Second compound: iodonium salt expressed by a chemical structural formula (8) or (9).

(8)

(9)

The symbols Ar and X in the chemical structural formulas (8) and (9) denote the same ones as those in the chemical structural formula (7).

(3) Third compound: sulfonium salt expressed by a chemical structural formula (10), (11), (12), (13), (14) or (15).

(10)

(11)

(12)

(13)

(14)

(15)

The symbols Ar and X in the chemical structural formulas (10) to (15) denote the same ones as those in the chemical structural formula (7), a symbol R denotes hydrocarbon such as a methyl group, and symbols $R_1$, $R_2$ and $R_3$ respectively denote a substituted or non-substituted aromatic group (for example, a phenyl group) or a substituted or non-substituted alicyclic group.

(4) Fourth compound: sulfonic acid ester expressed by a chemical structural formula (16) or (17).

(16)

(17)

The symbols Ar and X in the chemical structural formulas (16) and (17) denote the same ones as those in the chemical structural formula (7).

(5) Fifth compound: oxa-azole derivative product expressed by a chemical structural formula (18).

(18)

The symbol $X_3$ in the chemical structural formula (18) denotes the same one as the symbol X in the chemical structural formula (7) in principle. However, it is applicable that one of three —$CX_3$ groups be a substituted or non-substituted aryl group or a substituted or non-substituted alkenyl group.

(6) Sixth compound: s-triazine derivative product expressed by a chemical structural formula (19).

(19)

The symbol $X_3$ in the chemical structural formula (19) denotes the same one as the symbol X in the chemical structural formula (7) in principle. However, it is applicable that one of two —$CX_3$ groups be a substituted or non-substituted aryl group or a substituted or non-substituted alkenyl group.

(7) Seventh compound: di-sulfone derivative product expressed by a chemical structural formula (20).

(20)

The symbol Ar in the chemical structural formula (20) denotes the same one as that in the chemical structural formula (7).

(8) Eighth compound: imido compound expressed by a chemical structural formula (21), (22), (23) or (24).

(21)

(22)

(23)

(24)

The symbol X in the chemical structural formulas (21) to (24) denotes the same one as that in the chemical structural formula (7).

(9) Other compounds (nine compounds): oxime-sulfonate, diazo-naphthoquinone, benzoin-tosylate or the like.

As the acid generating agents classified into the first to nine compounds, names and general chemical structural formulas of four compounds are indicated as follows.

(i) triphenylsulfonium hexafluoroantimonate (25)

(ii) triphenylsulfonium hexafluorophosphate (26)

(iii) diphenyliodide hexafluorophosphate (27)

(iv) benzoin tosylate

(28)

(Synthesis of the Resist)

To perform a method for forming a resist pattern with the resist material, components of the chemical amplifier resist is adjusted by mixing the acid generating agent with a material selected from among the polymer, the copolymer and the products derived from the polymer or the copolymer. The copolymer is, for example, obtained by connecting a main chain of a polymer expressed by a chemical structural formula (28) with a main chain of a polymer expressed by a chemical structural formula (29). In the formula (29), a symbol "t" denotes "tertiary".

The component adjustment in a resist is generally performed in a resist chemical field. In this embodiment, a monomer expressed by the chemical structural formula (29) or (30) is, for example, selected, a ring-opening polymerization is performed for the monomers to form a polymer or a copolymer on condition that an appropriate polymerization initiator exists with the monomers, and an obtained ring-opened polymer is hydrogenated to form a polymer or copolymer. In this case, catalyst such as a halogenated compound obtained by halogenating transition metal (for example, tungsten (W) or molybdenum (Mo)), metal carbene or the like is used as the polymerization initiator. Also, noble metal catalyst or the like is used to perform the hydrogengeneration.

Thereafter, the acid generating agent is added into a solution of the obtained polymer or copolymer, so that an adjusted solution of the chemical amplifier resist is obtained.

In this case, an amount of the acid generating agent added to the polymer or copolymer can be changed in a wide range. In general, the amount of the acid generating agent generally ranges from about 1 to 30% by weight and preferably ranges from about 1 to 15% by weight.

Also, a type of solvent used to adjust the solution of the chemical amplifier resist can be changed according to a type of the resist, a coating condition and other conditions. For example, organic solvent such as cyclohexanone, propyleneglycol monomethylether acetate (PGMEA), lactic acid ethyl or the like is preferred as the solvent used in this embodiment.

(Patterning Method for the Chemical Amplifier Resist)

Next, a method for patterning a thin film arranged on a semiconductor substrate by using the chemical amplifier resist as a mask is described with reference to FIGS. 1 and 2. In this embodiment, a positive type resist is used.

Figure 1A:
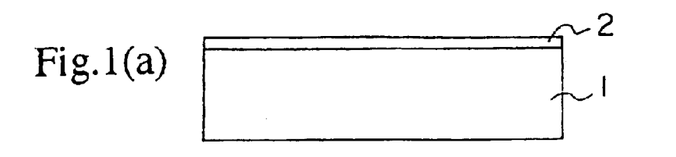
FIGS. 1(a) to 1(e) are cross-sectional views showing a first patterning process in which a thin film is patterned while using a resist material according to the present invention as a mask.

A solution in which the chemical amplifier resist is dissolved in the solvent and a thin film 2 arranged on a semiconductor substrate 1 shown in FIG. 1(a) are initially prepared. As the semiconductor substrate 1, any substrate made of a semiconductor, an insulator or a conductor usually used in a semiconductor apparatus or another apparatus can be used regardless of whether or not an electric circuit is arranged in the substrate. Also, a film made of silicon, an oxide film, polysilicon, a nitride film, aluminium or the like can be used as the thin film 2. Also, it is applicable that any thin film be not used and the substrate 1 be directly patterned.

Figure 1B:
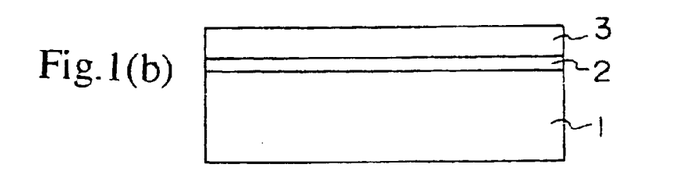

Thereafter, as shown in FIG. 1(b), the resist solution is coated on the thin film 2 by using a generally used coating apparatus such as a spin coater, a dip coater, a roller coater or the like, and a resist film 3 is formed on the thin film 2. A film thickness of the resist film 3 can be changed according to a using purpose of the resist film 3. In this embodiment, the film thickness of the resist film 3 ranges from about 0.3 to 2.0 μm.

Figure 1C:
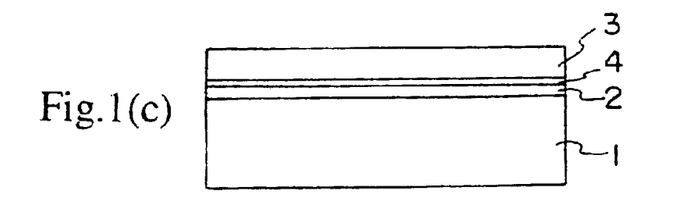

In this case, as shown in FIG. 1(c), it is preferred that an attachment promoting agent 4 such as hexamethyl disilazane (HMDS) be treated on the thin film 2 to improve the attachment of the thin film 2 and the resist film 3 and the resist film 3 be formed on the attachment promoting agent 4.

Figure 1D:
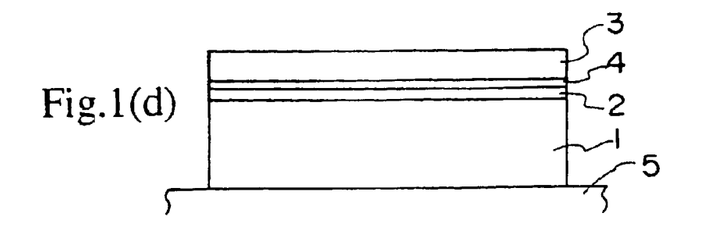

Thereafter, as shown in FIG. 1(d), the resist film 3 is pre-baked for a prescribed time ranging from about 60 to 180 seconds at a temperature ranging from about 60 to 150° C. or preferably ranging from 60 to 100° C. In this pre-baking operation, it is applicable that a heating means such as a hot plate 5 be used.

Figure 1E:
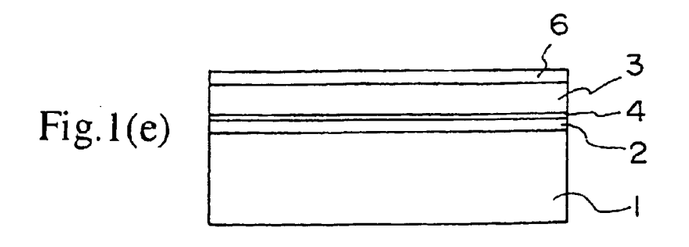

Thereafter, as shown in FIG. 1(e), a top coat film (or a protective film) 6 is formed on the resist film 3. For example, a solution of olefin resin is coated on the resist film 3 according to a spin coating method, the olefin resin solution is baked at a temperature of about 100° C., and the top coat film 6 is formed. However, it is applicable that the top coat film 6 be not formed on the resist film 3.

Figures 2A, 2B, 2C, 2D:
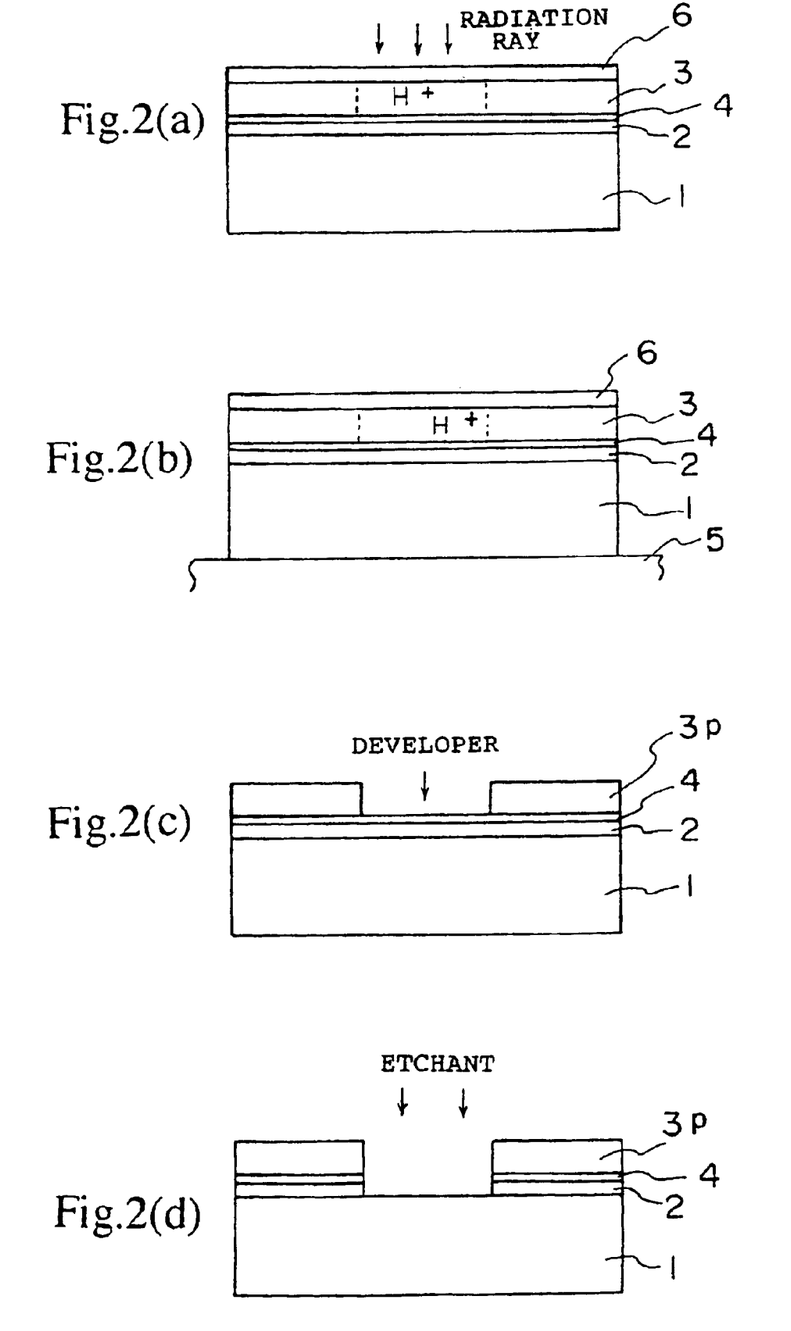
FIGS. 2(a) to 2(d) are cross-sectional views showing a second patterning process in which the thin film is patterned while using the resist material according to the present invention as a mask.

Thereafter, as shown in FIG. 2(a), after the resist film 3 is pre-baked, the resist film 3 is selectively exposed to a radiation ray by using a generally used exposing apparatus. As an appropriate exposing apparatus, an ultraviolet light (including far ultraviolet light and vacuum ultraviolet light) exposing apparatus, an electron ray exposing apparatus, an X ray exposing apparatus, an excimer stepper or the like is put on the market. Appropriate exposing conditions can be selected according to the conditions of the resist film 3.

When portions of the resist film 3 are irradiated with the radiation ray, acid is generated from the acid generating agent included in the portions of the resist film 3.

Thereafter, as shown in FIG. 2(b), a post exposure baking is performed for the resist film 3 exposed to the radiation ray at a temperature ranging from about 60 to 150° C. or preferably ranging from about 100 to 150° C., so that a chemical reaction in which the side chain group (or the protective group) attached to the alkali-soluble group is detached from the alkali-soluble group while using the acid as catalyst occurs. In this case, it is applicable that the post exposure baking be performed just after the pre-baking before the resist film 3 is exposed to the radiation ray.

Therefore, a chemical structure of the resist film 3 expressed by the formula (1) is changed to a chemical structure expressed by the formula (31), or a chemical structure of the resist film 3 expressed by the formula (2) is changed to a chemical structure expressed by the formula (32).

In cases where the top coat film 6 is arranged on the resist film 3, after the resist film 3 is exposed to the radiation ray and the post exposure baking is performed for the resist film 3, the top coat film 6 is detached and removed from the resist film 3 by using an organic solvent.

Thereafter, as shown in FIG. 2(c), the resist film 3 is developed by a developer according to a well-known method. In this case, an ammonium compound, a morpholine compound or a mixing product including the ammonium compound or the morpholine compound is, for example, used as a development agent, and the development agent is dissolved in water or alcohol to form the developer. Methanol, ethanol or propanol is, for example, used as the alcohol. A density of the development agent dissolved in the water or alcohol can be changed in a wide range. The density of the development agent generally ranges from about 0.1 to 15% by weight and preferably ranges from about 0.1 to 10% by weight in this embodiment.

As a preferred example of the ammonium compound, tetrabutylammonium hydroxide (TBAH), tetraethylammonium hydroxide (TEAH) or tetrapropylammonium hydroxide (TPAH) can be used. However, the ammonium compound is not limited to TBAH, TEAH or TPAH. Also, morpholine can be used as another preferred example of the developer.

The developer described above is useful in cases where the resist film 3 is used as a positive type. In contrast, in cases where a negative type resist film is used, a hydocarbon type organic solvent such as xylene, benzene or cyclohexane is used as the solvent because a polarity of the solvent is low.

A developing time generally ranges from about 1 to 5 minutes and preferably ranges from about 1 to 3 minutes. However, the developing time is not limited to the above time.

After the developing operation, the portions of the resist film 3 exposed to the radiation ray is dissolved in the developer and is removed, so that a resist film 3P formed in a desired pattern is obtained.

Finally, the patterned resist film 3P is rinsed with pure water according to a well-known method and is dried.

Therefore, as shown in FIG. 2(d), when portions of the thin film 2 not covered with the patterned resist film 3P are dry-etched, the desired pattern of the resist film 3P is transferred to the thin film 2. As the dry-etching, a plasma-etching, a reactive ion etching, a sputter etching or the like is used.

Assuming that an etching resistance of a patterned resist is low, when the thin film 2 is etched by etchant, the patterned resist cannot sufficiently function as a mask because the patterned resist is also exposed to the etchant. However, because it is ascertained by the inventors that the resist film 3 made of a resin including the cyclic hydrocarbon as a skeletal structure has a superior etching resistance as compared with that of a resist including the acrylate resin as a skeletal structure, the patterned resist film 3P can sufficiently function as a mask.

Hereinafter, nine experimental results of the patterned chemical amplifier resist are described as an example. However, the present invention is not limited to these experimental results.

FIRST EXAMPLE

The triphenylsulfonium hexafluoroantimonate is added to cyclic hydrocarbon resin expressed by a chemical structural formula (33) as the acid generating agent to form a mixed product in which the tri-phenyl-sulfonium-hexa-fluoro-antimonate is included by 5% by weight, the mixed product is dissolved in the cyclo-hexane, and a resist solution is obtained.

(33)

Thereafter, the resist solution is spin-coated on a silicon substrate at a film thickness of 0.7 μm. In this case, surface of the silicon substrate is treated in advance with the hexamethyl disilazane (HMDS). Thereafter, the silicon substrate is pre-baked on a hot plate for 100 seconds at a temperature of 100° C. to form a resist film. Thereafter, the resist film is selectively irradiated with KrF laser having a wavelength of 248 nm by using a KrF excimer stepper (numerical aperture (NA)=0.45) manufactured by the Nikon corporation, and a latent pattern is formed in the resist film. In this case, transparency of the resist film is the same as that of a conventional resist film.

Thereafter, the resist film in which the latent pattern is formed is baked for 60 seconds at a temperature of 150° C. Thereafter, the resist film is developed in a solution of tetramethylammonium hydroxide (TMAH) having a concentration of 0.27 N (N: normal) for 60 seconds, and the resist film is rinsed with pure water for 30 seconds. As a result, a patterned resist film having a desired pattern corresponding to a pattern of the portions of the resist film irradiated with the KrF laser is obtained without any defect or peeling of the resist film.

In this example, a threshold energy Eth of quantity of radiation is 21.2 mJ/cm$^2$, so that a resolving power of 0.3 μm at line and space is obtained.

SECOND EXAMPLE

The second example differs from the first example in that another developer is used and a threshold energy Eth of quantity of radiation is 25.6 mJ/cm$^2$. That is, a pattern resist film is formed according to the same method as in the first example.

As the developer, a solution of the tetrabutyl ammonium hydroxide (TBAH) having a concentration of 0.27 N is used.

As a result, a pattern resist film is obtained in the same manner as in the first example. Because of the threshold energy Eth of 25.6 mJ/cm$_2$, a resolving power of 0.275 μm at line and space is obtained.

THIRD EXAMPLE

The third example differs from the first example in that another developer is used and a threshold energy Eth of quantity of radiation is 9.6 mJ/cm$^2$. That is, a pattern resist film is formed according to the same method as in the first example.

As the developer, a solution obtained by mixing the TMAH solution of 0.27 N with iso-propyl-alcohol (IPA) is used. A mixing ratio is 3 (TMAH) to 1 (IPA).

As a result, a pattern resist film is obtained in the same manner as in the first example. Because of the threshold energy Eth of 9.6 mJ/cm$^2$, a resolving power of 0.325 μm at line and space is obtained.

FOURTH EXAMPLE

The triphenylsulfonium hexafluoroantimonate is added to cyclic hydrocarbon resin expressed by a chemical structural formula (34) as the acid generating agent to form a mixed product in which the triphenylsulfonium hexafluoroantimonate is included by 5% by weight, the mixed product is dissolved in the cyclo-hexane, and a resist solution is obtained.

(34)

Thereafter, the resist solution is spin-coated on a silicon substrate at a film thickness of 0.7 μm. In this case, a surface of the silicon substrate is cleaned in advance with the HMDS. Thereafter, the silicon substrate is pre-baked on a hot plate for 100 seconds at a temperature of 100° C. to form a resist film. Thereafter, the resist film is selectively irradiated with KrF laser having a wavelength of 248 nm by using the KrF excimer stepper (NA=0.45) manufactured by the Nikon corporation, and a latent pattern is formed in the resist film.

Thereafter, the resist film in which the latent pattern is formed is baked for 60 seconds at a temperature of 150° C. Thereafter, the resist film is developed in a solution of tetramethylammonium hydroxide (TMAH) having a concentration of 0.27 N (N: normal) for 60 seconds, and the resist film is rinsed with pure water for 30 seconds. As a result, a patterned resist film having a desired pattern corresponding to a pattern of the portions of the resist film irradiated with the KrF laser is obtained without any defect or peeling of the resist film.

In this example, a threshold energy Eth of quantity of radiation is 13.2 mJ/cm$^2$, so that a resolving power of 0.3 μm at line and space is obtained.

FIFTH EXAMPLE

The fifth example differs from the first example in that another developer is used and a threshold energy Eth of quantity of radiation is 15.6 mJ/cm$^2$. That is, a pattern resist film is formed according to the same method as in the first example.

As the developer, a solution of the tetrapropylammonium hydroxide (TPAH) having a concentration of 0.27 N is used.

As a result, a pattern resist film is obtained in the same manner as in the second example. Because of the threshold energy Eth of 15.6 mJ/cm$^2$, a resolving power of 0.275 μm at line and space is obtained.

SIXTH EXAMPLE

The sixth example differs from the first example in that another developer is used and a threshold energy Eth of quantity of radiation is 5.6 mJ/cm$^2$. That is, a pattern resist film is formed according to the same method as in the first example.

As the developer, a solution obtained by mixing the TMAH solution of 0.27 N with IPA is used. A mixing ratio is 3 (TMAH) to 1 (IPA).

As a result, a pattern resist film is obtained in the same manner as in the first example. Because of the threshold energy Eth of 5.6 mJ/cm$^2$, a resolving power of 0.325 μm at line and space is obtained.

SEVENTH EXAMPLE

Transmissivity of the resist film described in the first example is examined. In case of the exposure of the KrF laser having the wavelength of 248 nm, the transmissivity is 99.2%/μm. In case of the exposure of an ArF laser having a wavelength of 193 nm, the transmittance is 85%/μm. Therefore, because the transmittance is high, it is ascertained that the resist film described in the first example is applicable for the ArF laser.

Also, in cases where the resist film is made of a 1:1 copolymer of adamantylmethacrylate t-butylacrylate, the transmittance is 95%/μm for the KrF laser having the wavelength of 248 nm, and the transmittance is 56%/μm for the ArF laser having the wavelength of 193 nm.

EIGHTH EXAMPLE

The acid generating agent in the first example is added to the cyclic hydrocarbon resin to form a mixed product in which the acid generating agent is included by 2% by weight, a film thickness of the resist film is set to 0.4 μm, and the resist film is exposed to the ArF laser having the wavelength of 193 nm. As a result, a resolving power of 0.225 μm at line and space is obtained when a threshold energy Eth of quantity of radiation is 8 mJ/cm$^2$.

NINTH EXAMPLE

A dry-etching resistance of the resist film obtained in the first example is examined.

$CF_4$ is used as an etching gas, a flow rate of the etching gas is set to 100 sccm (standard cc per minute), an atmosphere pressure of the etching gas is set to 0.02 Torr, an electric power supplied through a pair of electrodes to the etching gas atmosphere is set to 200 W, and an etching time is set to 5 minutes. In these conditions, an etching resistance of the resist film obtained in the first example is compared with that of a novolak resist. An intensity of the etching resistance is shown in an etching rate.

As a result, in cases where an etching rate is normalized by an etching rate of the novolak resist (an etching rate of the novolak resist=1), as shown in Table 1, an etching rate of the resist film obtained in the first example is equivalent to 0.95 (a normalized etching rate=0.95). Therefore, a little good etching resistance is obtained.

In the same conditions, an etching rate of the 1:1 copolymer of adamantylmethacrylate t-butylacrylate is examined. As shown in Table 1, an etching rate of the 1:1 copolymer is equivalent to 1.1 (a normalized etching rate

TABLE 1

| STRUCTURAL FORMULA | NORMALIZED ETCHING RATE |
|---|---|
| (structure shown) | 1.1 |

TABLE 1-continued

| STRUCTURAL FORMULA | NORMALIZED ETCHING RATE |
|---|---|
|  | 0.95 |

Therefore, it is ascertained that the resist material including the cyclic hydrocarbon as a skeletal structure has a superior etching resistance as compared with that of another resist material including the acrylate resin as a skeletal structure.

Having illustrated and described the principles of the present invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A resist material comprising:

a polymer or copolymer having a first chemical structural formula (1) or a second chemical structural formula (2), (1)

(2)

wherein symbol R is a 3-oxo ester group which is detached by function of an acid, symbol $R_1$ denotes hydrogen (H) or an alkyl group ($C_mH_{2n+1}$) and symbols n and m respectively denote a natural number.

2. A resist material according to claim 1, wherein R is selected from the group consisting of a 3-oxocyclohexyl ester group, a 3-oxo-1-iso-propyl-butyl ester group, a 3-oxobutyl ester group, a 3-oxo-2-methyl-butyl ester group, a 3-oxo-1,1-dimethyl-butyl ester group, a 3-oxo-1-methylbutyl ester group, and a lactone ring containing group shown by the chemical structural formula (5)

(5)

3. A resist material according to claim 2, comprising:

an acid generating agent for generating an acid in cases where the acid generating agent is irradiated with a radiation ray to detach the side chain from the alkalisoluble group by a function of the acid.

4. A resist material according to claim 3 in which the acid generating agent is selected from the group consisting of di-azonium salt, iodonium salt, sulfonium salt, sulfonic acid ester, oxaazole derivative product, s-triazine derivative product, di-sulfone derivative product, imido compound, oxime-sulfonate, diazonaphthoquinone or benzoin-tosylate.

5. A method for forming a resist pattern, comprising the steps of:

preparing a polymer or copolymer which has a first chemical structural formula (1) or a second chemical structural formula (2), (1)

(2)

wherein symbol R is a 3-oxo ester group which is detached by function of an acid, symbol $R_1$ denotes hydrogen (H) or an alkyl group ($C_mH_{2n+1}$) and symbols n and m respectively denote a natural number;

preparing an acid generating agent for generating an acid in cases where the acid generating agent is irradiated with a radiation ray;

coating a resist material, in which the polymer or the copolymer and the acid generating agent are included, on a patterning material planned to be patterned;

pre-baking the resist material arranged on the patterning material;

irradiating a desired region of the resist material with a radiation ray to generate the acid from the acid generating agent included in the desired region of the resist material;

detaching the protective group included in the desired region of the resist material from the alkali-soluble group by a function of the acid to form a latent image in the resist material;

post-baking the resist material in which the latent image is formed;

developing the resist material post-baked; and forming a patterned resist material having a resist pattern.

6. A method for forming a resist pattern according to claim 5, wherein R is selected from the group consisting of a 3-oxocyclohexyl ester group, a 3-oxo-1-iso-propyl-butyl ester group, a 3-oxo-butyl ester group, a 3-oxo-2-methyl-butyl ester group, a 3-oxo-1,1-dimethyl-butyl ester group, a 3-oxo-1-methyl-butyl ester group, and a lactone ring containing group shown by the chemical structural formula (5)

(5)

7. A method for forming a resist pattern according to claim 6 in which the step of coating a resist material includes a step of:
setting an amount of the acid generating agent in a range from 1 to 30% by weight in resist material.

8. A method for forming a resist pattern according to claim 7 in which the step of coating a resist material includes a step of:
arranging an attachment promoting agent such as hexamethyldisilazane (HMDS) between the resist material and the patterning material to improve the attachment of the resist material and the patterning material.

9. A method for forming a resist pattern according to claim 8 in which the step of coating a resist material includes a step of:
preparing a development agent;
dissolving the development agent in water or alcohol to form a developer having a density in a range from 0.1 to 15% by weight; and
immersing the resist material in the developer.

10. A method for forming a resist pattern according to claim 9 in which the step of coating a resist material includes a step of:
preparing a development agent selected from the group consisting of an ammonium compound such as tetrabutylammoniumhydroxide (TBAH), tetraethylammoniumhydroxide (TEAH) or tetrapropylammoniumhydroxide (TPAH), a morpholine compound, morpholine or a mixing product including the ammonium compound or the morpholine compound;
dissolving the development agent in water or alcohol to form a developer; and
immersing the resist material in the developer.

* * * * *